United States Patent
Cornu et al.

[11] 3,984,858
[45] Oct. 5, 1976

[54] SEMICONDUCTOR COMPONENTS

[75] Inventors: Jozef Cornu, Staretschwil; Alois Marek, Nussbaumen, both of Switzerland

[73] Assignee: BBC Brown Boveri & Company Limited, Baden, Switzerland

[22] Filed: May 22, 1973

[21] Appl. No.: 363,165

[30] Foreign Application Priority Data
June 9, 1972 Switzerland.......................... 8589/72
Apr. 13, 1973 Switzerland.......................... 5291/73

[52] U.S. Cl................................... 357/38; 357/58; 357/90
[51] Int. Cl.² ........................................ H01L 29/74
[58] Field of Search............... 317/235 AB, 235 AD; 357/38, 86, 58, 90

[56] References Cited
UNITED STATES PATENTS

| | | | |
|---|---|---|---|
| 3,231,796 | 1/1966 | Shombert............................. | 357/38 |
| 3,277,352 | 10/1966 | Hubner.................................. | 357/38 |
| 3,370,209 | 2/1968 | Davis et al............................ | 317/235 |
| 3,398,334 | 8/1968 | Shockley............................... | 317/234 |
| 3,439,239 | 4/1969 | Herlet et al........................... | 317/235 |
| 3,538,401 | 11/1970 | Chu ....................................... | 317/235 |
| 3,855,611 | 12/1974 | Neilson et al......................... | 357/38 |

FOREIGN PATENTS OR APPLICATIONS
1,279,203 10/1968 Germany

OTHER PUBLICATIONS
J. Holt, "The Poss. of Sw. Act. in a Si Thyr. Str. W. Thick Intrinsic Layers," Int. J. Electronics, vol. 29, No. 2, 1970, pp. 149–155.

Primary Examiner—Michael J. Lynch
Assistant Examiner—Joseph E. Clawson, Jr.
Attorney, Agent, or Firm—Oblon, Fisher, Spivak, McClelland & Maier

[57] ABSTRACT

A semiconductor component having at least three p-n-junctions which may be switched from a blocking state to a conducting state. The base zone, positioned between the second and third p-n-junctions, is characterized in that it comprises three single zones, the center zone of which is more highly doped and appreciably thinner than either of the two outer zones. The doping concentrations in the two outer zones are equal to one another and appreciably lower than that in a control zone, which is positioned between the first and second p-n-junctions. The effect of the foregoing construction is to reduce the recovery time of the semiconductor component without causing an increase in the forward potential drop, or vice-versa.

4 Claims, 3 Drawing Figures

SEMICONDUCTOR COMPONENTS

BACKGROUND OF THE INVENTION

1. Field of the Invention

This invention relates to a bistable semi-conductor component and more particularly to one having at least three p-n junctions and which may be switched from a blocked state to a conducting state. One zone is called the base and is located between the second and third p-n junctions. Another zone is called the control zone and is located between the first and second p-n junctions. Such semi-conductor components are generally referred to as thyristors.

2. Description of the Prior Art

Known thyristors generally consist of four zones, comprised alternately of N and P type semiconductor material. When in the forward-conducting state, the inner zones, in particular the high-ohmic base, will be flooded with charge carriers. This flooding causes a delay in the blocking capacity of the thyristor in its backward blocking state as regards the renewed forward potential, because the excess charge carriers first must decay by recombining in the base (see for instance Koehl, Scientia Electrica, vol. XI, fasc. 1, 1965, p. 30–31). The charge carrier density in the flooded state being some 10 orders of magnitude over the carrier density in the equilibrium state, it is assumed that on the average approximately four-fold to ten-fold of the average carrier life is required for complete decay of carrier excess by recombination. This time which is required for carrier decay is called the release time.

However, the reduction of carrier life in order to reduce the release time is limited to the extent that below a critical lifetime for a given base width, the drop in transmission potential will increase exponentially. While one may thus improve the dynamic blocking behavior of the thyristor by decreasing the carrier life, and thus improve the release time, a degradation of the conducting behavior below a certain limit must be simultaneously expected.

SUMMARY OF THE INVENTION

Accordingly, an object of the present invention is to overcome the above-mentioned opposing requirements, that is, to further reduce the carrier life and hence the release time of a thyristor without causing an increase in the forward potential drop, or to decrease the forward potential drop without thereby causing a larger carrier life and hence a larger release time.

The foregoing and other objects are attained in accordance with one aspect of the present invention through the provision of at least three individual zones for the base, the center one being higher doped and thinner than either of the outer zones, and the doping concentration of the latter being the same for both and appreciably lower than in the control zone.

This measure allows the carrier life and hence the recovery time of a thyristor to be reduced by one-third or one-fourth as compared to known devices with the same forward potential drop. Again, one may obviously reduce the latter for constant carrier life.

A thyristor with an n-base consisting of a central, highly-doped single zone between two low n-doped single zones has already been published in a purely diagrammatic form (German Auslegeschrift No. 1,299,766, FIG. 2). This diagram, however, in no way communicates to a person of ordinary skill in the art the teachings of the present invention with its concomitant advantages. The same consideration applies to U.S. Pat. No. 3,538,401 (see FIG. 19+).

BRIEF DESCRIPTION OF THE DRAWINGS

Various objects, features and attendant advantages of the present invention will be more fully appreciated as the same becomes better understood from the following detailed description of the present invention when considered in connection with the accompanying drawings, in which.

DETAILED DESCRIPTION OF A PREFERRED EMBODIMENT

The conduction potential drop in the base is approximately proportional to the base width and to the carrier life as $\exp(d/L)$, where $d$ is the half-width of the base and $L = \sqrt{D\tau_B}$, i.e., the diffusion length, wherein $D$ = a diffusion constant and $\tau_B$ = the base carrier life.

There is a critical value of carrier life for each base width, below which the conduction potential drop in the base will rapidly increase. On the other hand, the conduction potential drop is also appreciably determined by the minimum base carrier density in the forward conduction state, which is proportional to the expression $1/\cosh(d/L)$.

Figure 1:
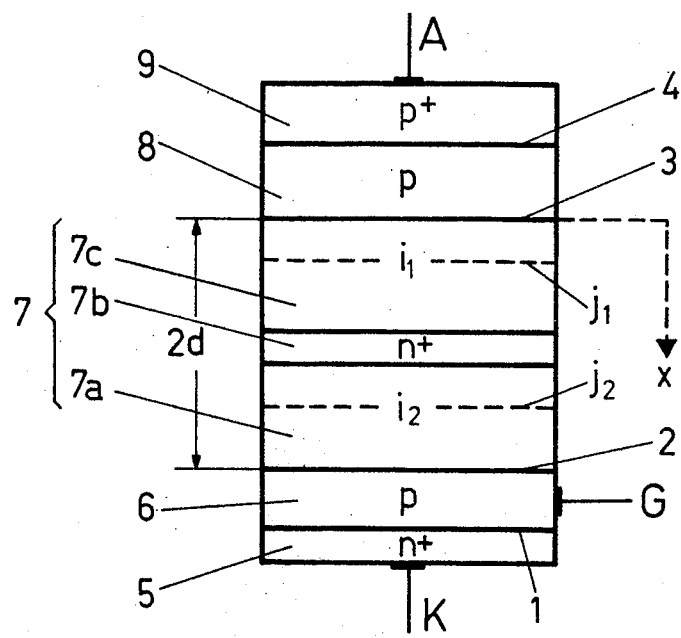
FIG. 1 is a schematic representation of a preferred embodiment of the present invention.

Referring now to the drawings, wherein like reference numerals designate identical or corresponding parts throughout the several views, and more particularly to FIG. 1 thereof, a thyristor is shown as comprising a first p-n junction 1, a second p-n junction 2, a third p-n junction 3 and a fourth p-n junction 4. The thyristor also comprises a high n-doped (n+) zone 5, a p-doped zone 6, a base 7 consisting of the single zones 7a, 7b and 7c, a p-doped zone 8 and a high p-doped (p+) zone 9. The zone 5 with a cathode K acts an n-emitter, the zone 9 provided with an anode A acts as a p-emitter, and zone 6 provided with a control electrode G acts as a control zone. The base width is seen to be $2d$. As shown by FIG. 1, in lieu of a single high-ohm n-base, there is provided a structure with three single zones $i_1$, $n^+$, and $i_2$, where $i_1$ and $i_2$ are each an intrinsic conduction zone and $n^+$ comprises a high-doped donor zone. Therefore, the effective base width is practically only half the initial value, even though the total thickness of the thyristor has been increased insignificantly. This is due to the increase in carrier density during forward conduction in the domain of the single zone 7b. The minimum carrier density determining the conduction voltage drop now may be approximated by $1/\cosh(d/2L)$. Thus, the conduction potential drop will be appreciably reduced for the same carrier life. On the other hand, if the conduction potential drop remains constant, one can consider the lifetimes, which are 3–4 fold smaller than previously, so that a 3–4 fold shorter release time ensues. The electrical field intensity for the structure shown in blocking zones $i_1$ and $i_2$ is constant, in contrast to the quasilinear drop in the conventional high-ohm n-zone. Therefore, each of the $i$-zones need be only half as thick as the original n-zones.

It is also of great significance that by means of the measures described, the negative angle which is required for chamfering the thyristor for improving its static blocking behavior (see for instance U.S. Pat. Nos. 3,491,272 or 3,575,644) may be less steep for the same blocking performance, and thereby a considerable gain in the active surface may be achieved.

The carrier concentration in a preferred embodiment in the center zone ($7b$) was approximately $10^{17}$ –$10^{18}$/cm$^3$, while being $10^{13}$/cm$^3$ for the two outer zones ($7a$ and $7c$). The other zones 5,6,8 and 9 were doped conventionally (see for instance Scientia Electrica, XI, vol. XI, 1965).

The three-layer base 7 has the advantage that the excess carriers need only diffuse over half as large a path as in known thyristors before being able to recombine in a high-doped zone. One achieves a reduction in relese time by a factor of 2 for a constant carrier density gradient, and if the latter may be neglected, by a factor of 4; the path $d$ covered by a carrier in time $t$ being given by $d \sim \sqrt{t}$.

Figure 2:
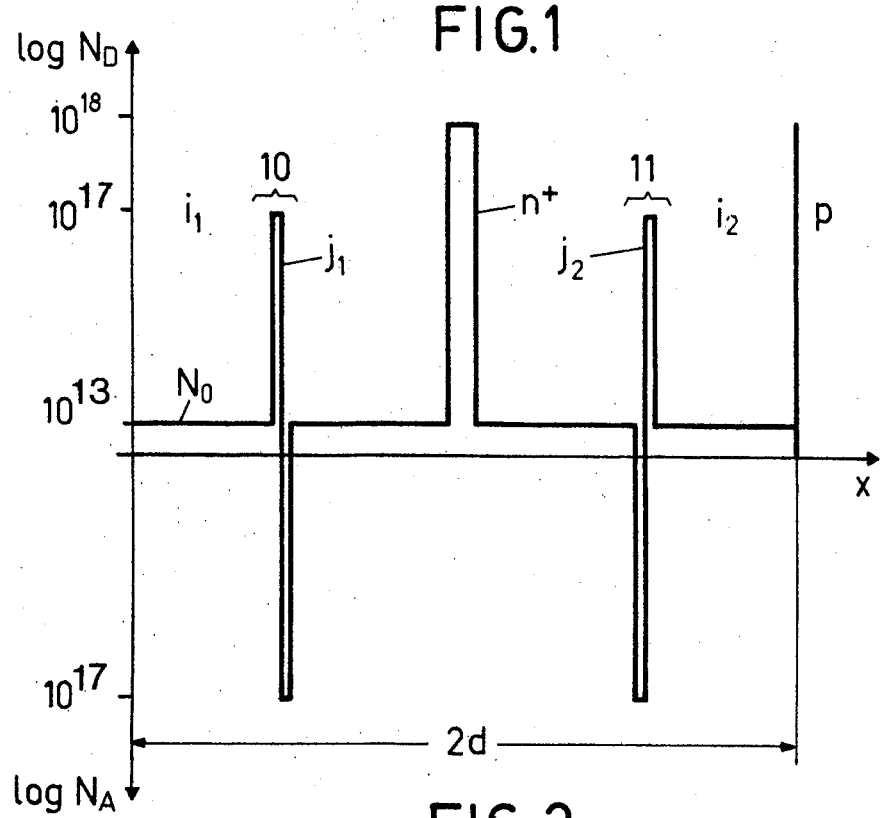
FIG. 2 is a schematic doping profile in the base of a preferred embodiment which is additionally provided with p-n junctions.

According to another embodiment, p-n junctions $j_1$ and $j_2$ may be provided in the two slightly doped single zones $7a$ and $7c$, as shown by dashed lines in FIG. 1. Doping then may be as shown in FIG. 2, wherein the donor concentrations $N_D$ are plotted in the positive ordinate direction and the acceptor concentrations $N_A$ are plotted in the negative ordinate direction as a function of the base width $x$. A further increase in the minimum carrier density of the base in the conducting state may be achieved by means of the base structure of FIG. 2, and therefore would effectuate a further decrease of the conducting potential drop.

Figure 3:
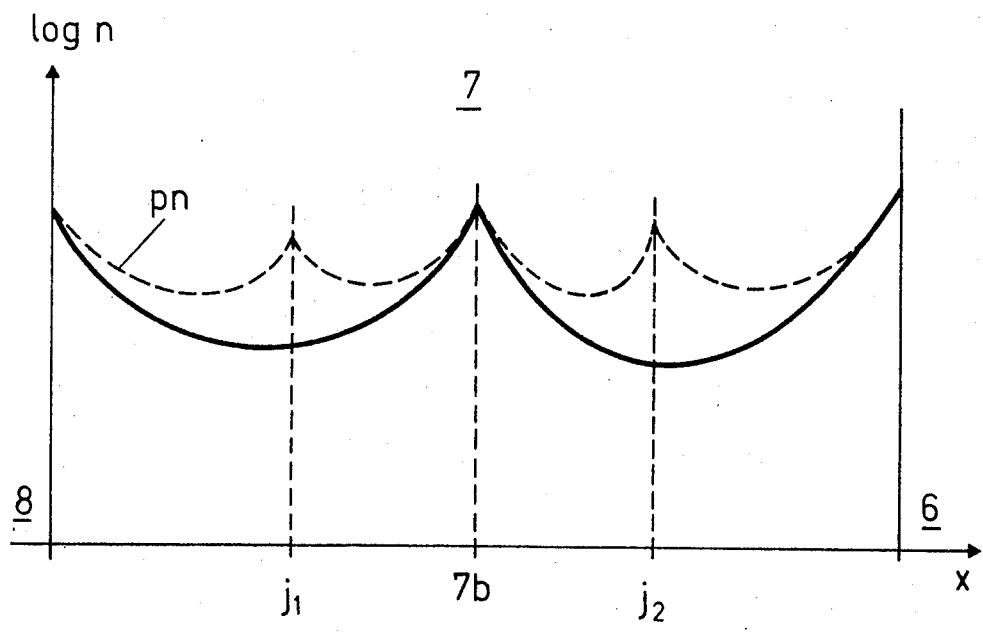
FIG. 3 represents graphically the charge-carrier density functions in a base of the present invention in the forward conduction state with p-n junctions and in a base without same.

FIG. 3 shows the carrier density in the base of the forward conducting thyristor as a function of base width $x$ in the absence of p-n junctions (solid line) and in their presence (dashed line). As can be seen, the carrier density distribution has a maximum in the range of the single center zone $7b$, and, according to the dashed line, also has maxima in the range of the p-n transitions $j_1$ and $j_2$.

The p-n junctions $j_1$ and $j_2$ must be relatively thin in order not to hamper the switching-on of the thyristor. The $j_1$ and $j_2$ junctions may be constructed, for instance, at a density of about $10^{17}$/cm$^3$ for a thickness of abut 10 microns by means of an increase in n-doping, and at about $10^{17}$/cm$^3$ for the same thickness by means of an immediately ensuing p-doping. The thyristor breakdown potential will be somewhat degraded by the p-n junctions $j_1$ and $j_2$.

The same structures may be constructed epitaxially. However, when growing the thyristor crystal from the melt, the desired doping function may be achieved by means of suitable temperature steps, for instance by means of the Peltier effect, and in such manner that the temperature steps will affect the growth rate and hence the doping (see, for instance, J. El. Chem. Soc., 1971, 1014).

In summary, the structure of the invention provides the following advantages:

If the release time is kept constant, the forward potential may be decreased.

If the forward potential is kept constant, the release time may be shortened by as much as a factor of 4.

The inverse voltage may be increased as much as 30%.

For constant static blocking behavior, smaller chamfering angles may be used, resulting in a gain in active surfaces.

For a constant chamfer angle, a steeper doping function may be provided in the p-zones 6 and 8 so that the latter may be made thinner.

A thyristor according to the invention (without additional p-n junctions $j_1$ or $j_2$) may be made as follows:

For a maximum inverse voltage of 2,500 V, the thickness of the space charging zone in the base for a doping of $10^{11}$/cm$^3$ (corresponding practically to inherent conduction) of single zones $7a$ and $7c$ ($10^{18}$/cm$^3$ for single zone $7b$) will be about 125 microns. Therefore, the single zones $7a$ and $7c$ will always be made 125 microns thick, so that the base 7 as a whole will have a thickness of 250 microns. Each of the p-zones 6 and 8 is about 30 microns thick.

For a life of about 2 microseconds in zones 6, 7 and 8, the structure of the invention will provide a recovery time of about 40 microseconds for a forward potential drop of about 1.2V and 200 amp/cm$^2$.

For a life of 0.5 microseconds, the recovery time is 10 microseconds and the forward potential drop is about 1.8 V. Because of its extremely short recovery time, such a component may be operated for main potential frequencies up to 50 kHz.

On the other hand, a conventional semiconductor component with a $5 \times 10^{13}$/cm$^3$ doped n-base and a spatial charging zone of $2 \times 125$ microns will have a total base thickness of 430 microns ($2 \times 125$ microns plus 40% neutral zone plus 80 microns margin for expansion fluctuations). The p-zones may again each be 30 microns, so that their total thickness is 60 microns.

For a forward potential drop of 1.8V, such structures will require a carrier life of at least 4 microseconds, and, for an operating temperature of 125°C, the recovery time will be 80 microseconds. Such a component can no longer be operated beyond frequencies of 6.25 kHz, because it will not be blocking when the forward potential is re-established.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. A bistable semiconductor component which may be switched from a blocking state to a conducting state, which comprises a body of semiconductor material including first, second and third sequentially arranged p-n junctions, a base zone between said second and third p-n junctions and a control zone between said first and second p-n junctions, said base zone comprising three zones in a layered configuration, each of said three zones arranged generally parallel to said p-n junctions and extending across the width of said body of semiconductor material, a center zone positioned between two outer zones, said center zone being more highly doped and thinner than either of said two outer zones, and the doping concentrations of said two outer zones being equal to one another and lower than the doping concentration in said control zone, the semiconductor component further comprising thin p and n zones forming a fourth p-n junction located within one of said two outer zones.

2. A bistable semiconductor component which may be switched from a blocking state to a conducting state, which comprises a body of semiconductor material including first, second and third sequentially arranged p-n junctions, a base zone between said second and third p-n junctions and a control zone between said first and second p-n junctions, said base zone comprising three zones in a layered configuration, each of said three zones arranged generally parallel to said p-n junctions and extending across the width of said body of semiconductor material, a center zone positioned between two outer zones, said center zone being more highly doped and thinner than either of said two outer zones, and the doping concentrations of said two outer zones being equal to one another and lower then the doping concentration in said control zone, the semiconductor component further comprising thin p and n zones forming fourth and fifth p-n junctions with the fourth p-n junction located within one of said two outer zones and the fifth p-n junction located within the other of said two outer zones.

3. A semiconductor component as defined in claim 1, wherein said fourth p-n junction is comprised of a p-doped zone and an n-doped zone, the combined thicknesses of which are less than that of said center zone.

4. A semiconductor component as defined in claim 2, wherein said fourth and fifth p-n junctions are each formed of a p-doped zone and an n-doped zone, the pair of zones forming each of said fourth and fifth junctions having a combined thickness which is less than that of said center zone.

* * * * *